United States Patent
Shaheen et al.

(10) Patent No.: US 6,933,436 B2
(45) Date of Patent: Aug. 23, 2005

(54) PHOTOVOLTAIC CELL

(75) Inventors: Sean Shaheen, Cave Creek, AZ (US); Christoph Brabec, Linz (AT); Thomas Fromherz, Rottenegg (AT); Franz Padinger, St. Florian (AT); Sedar Sariciftci, Linz (AT); Erhard Gloetzl, Linz (AT)

(73) Assignee: Konarka Austria Forschungs und Entwicklungs GmbH (AU)

( * ) Notice: Subject to any disclaimer, the term of this patent is extended or adjusted under 35 U.S.C. 154(b) by 0 days.

(21) Appl. No.: 10/258,708

(22) PCT Filed: Apr. 27, 2001

(86) PCT No.: PCT/AT01/00129
§ 371 (c)(1),
(2), (4) Date: May 22, 2003

(87) PCT Pub. No.: WO01/84645
PCT Pub. Date: Nov. 8, 2001

(65) Prior Publication Data
US 2004/0094196 A1 May 20, 2004

(30) Foreign Application Priority Data
Apr. 27, 2000 (AT) .................. A 734/2000

(51) Int. Cl.⁷ .................. H01L 51/20; H01L 31/0248
(52) U.S. Cl. .................. 136/263; 136/256; 136/252; 257/40; 257/431; 257/461; 257/464
(58) Field of Search .................. 136/263, 256, 136/252; 257/40, 431, 461, 464

(56) References Cited

U.S. PATENT DOCUMENTS

| | | | |
|---|---|---|---|
| 5,006,915 A | 4/1991 | Yoshikawa et al. | |
| 5,009,958 A | 4/1991 | Yamashita et al. | |
| 5,009,985 A | 4/1991 | Kunitz et al. | |
| 5,131,956 A | * 7/1992 | Oohara et al. | 136/256 |
| 5,171,373 A | 12/1992 | Hebard et al. | |
| 5,178,980 A | 1/1993 | Mort et al. | |
| 5,185,208 A | 2/1993 | Yamashita et al. | |
| 5,221,854 A | * 6/1993 | Banerjee et al. | 257/431 |
| 5,247,190 A | 9/1993 | Friend et al. | |
| 5,331,183 A | 7/1994 | Sariciftci et al. | |

(Continued)

FOREIGN PATENT DOCUMENTS

| | | | |
|---|---|---|---|
| JP | 57-126173 A | * | 8/1982 |
| JP | 60-149177 | | 8/1985 |
| WO | WO94/05045 | | 3/1994 |
| WO | WO 99/49525 | | 9/1999 |
| WO | WO 99/49525 A1 | * | 9/1999 |
| WO | WO 01/84645 | | 11/2001 |
| WO | WO 01/86734 | | 11/2001 |

OTHER PUBLICATIONS

Kay et al, Solar Energy Materials and Solar Cells, 44, pp. 99–117, (1996).*

Papageorgiou et al, Journal of the Electrochemical Society, 146(3), pp. 898–907 (1999).*

Shaheen et al, "2.5% Efficient Organic Plastic Solar Cells," Applied Physics Letters, vol. 78, No. 6, pp. 841–843, Feb. 2001.*

(Continued)

Primary Examiner—Alan Diamond
(74) Attorney, Agent, or Firm—Fish & Richardson P.C.

(57) ABSTRACT

A photovoltaic cell is described, having a photoactive layer (4) made of two molecular components, namely an electron donor and an electron acceptor, particularly a conjugated polymer component and a fullerene component, and having two metallic electrodes (2, 5) provided on both sides of the photoactive layer (4). In order to provide advantageous construction ratios, it is suggested that an electrically insulating transition layer (6), having a thickness of at most 5 nm, be provided between at least one electrode (5) and the photoactive layer (4).

27 Claims, 1 Drawing Sheet

U.S. PATENT DOCUMENTS

| | | | |
|---|---|---|---|
| 5,350,459 A | | 9/1994 | Suzuki et al. |
| 5,454,880 A | * | 10/1995 | Sariciftci et al. ............ 136/263 |
| 5,470,910 A | | 11/1995 | Spanhel et al. |
| 5,670,791 A | | 9/1997 | Halls et al. |
| 5,677,572 A | * | 10/1997 | Hung et al. ................. 257/750 |
| 5,677,573 A | | 10/1997 | Prall et al. |
| 5,698,048 A | | 12/1997 | Friend et al. |
| 5,759,725 A | | 6/1998 | Hirao et al. |
| 5,986,206 A | * | 11/1999 | Kambe et al. .............. 136/263 |
| 6,198,092 B1 | * | 3/2001 | Bulovic et al. .......... 250/214.1 |
| 6,239,355 B1 | | 5/2001 | Salafsky |
| 6,281,430 B1 | * | 8/2001 | Lupo et al. ................. 136/263 |
| 6,291,763 B1 | * | 9/2001 | Nakamura .................. 136/256 |
| 6,303,943 B1 | * | 10/2001 | Yu et al. ....................... 257/40 |
| 6,580,027 B2 | | 6/2003 | Forrest et al. |
| 2002/0036298 A1 | * | 3/2002 | Nelles et al. ............... 257/136 |
| 2002/0117201 A1 | * | 8/2002 | Nelles et al. ............... 136/263 |
| 2003/0062082 A1 | * | 4/2003 | Miteva et al. .............. 136/263 |
| 2003/0067000 A1 | * | 4/2003 | Nelles et al. ................. 257/40 |
| 2003/0159729 A1 | * | 8/2003 | Shaheen et al. ............ 136/263 |

OTHER PUBLICATIONS

Brabec et al, "Organic photovoltaic devices produced from conjugated polymer/methanofullerene bulk heterojunctions," Synthetic Metals, 121, pp. 1517–1520, Mar. 2001.*

Pettersson et al, "Modeling photocurrent action spectra of photovoltaic devices based on organic thin films," Journal of Applied Physics, vol. 86, No. 1, Jul. 1, 1999.*

Jabbour, et al. "Aluminum based cathode structure for enhanced electron injection in electroluminescent organic devices." *Applied Physics Letters*, 73:9, pp 1185–1187. Aug. 31, 1998.

Hung et al. "Enhanced electron injection in organic electroluminescence devices using an AL/LiF electrode." *Applied Phys. Lett.*, 70:2, Jan. 13, 1997.

Apperloo et al. Doping in Solution as an Order–Inducing Tool Prior to Film Formation of Regio–Irregular. *Advanced Materials*, 12:21, pp. 1594–1597 (2000).

Conboy et al. "Impact of Solvent Vapor Annealing . . . " *Journal of Physical Chemistry B*, 102:23, pp. 4516–4525, 1998.

Gao et al. "Efficient photodetectors and . . . " *Synthetic Metals*, 84, pp. 979–980, (1997).

Gao et al. "Polymer P–I–N Junction Photovoltaic Cells." *Advanced Materials*, 10:9, pp. 692–695 (1998).

Ho et al. "Ultrathin Self–assembled Layers at the Ito Interface to Control Charge Injection and Electroluminescence Efficiency in Polymer Light–Emitting Diodes." *Advanced Material*, 10:10, pp. 769–774 (1998).

Hung, L.S. et al. "Enhanced Electron Injection in Organic Electroluminescence Devices Using an Al/LIF Electrode." 70, Nr. 2, Jan. 1997.

Matsumura M. et al. "Effect of Al/LiF Cathodes on emission efficiency of organic EL devices." *Thin Solid Films*, 331, Nr. 1–2, Oct. 1998.

Pettersson, Leif, A.A. et al., Modeling photocurrent action spectra of photovoltaic devices based on organic thin films. *Journal of Applied Physics*. 86:1, pp. 487–496, Jul. 1, 1999.

Quali et al. "Oligo(phenylenevinylene)/Fullerene Photovoltaic Cells Influence of Morphology." *Advanced Materials*, 11:18, pp. 1515–1518, (1999).

Roman et al. "High Quantum Efficiency Polythiopene/C60 Photodiodes." *Advanced Materials*, 10:10, pp. 774–777 (1998).

Roman et al. "Multifunctional Polythiophenes in Photodiodes." *Synthetic Metals*, 102:1–3, pp. 977–978 (1998).

Roman et al. "Photodiode Performance and . . . " *Advanced Materials*, 9:15, pp. 1164–1168, (1997).

Shaheen et al. "2.5% efficient organic plastic solar cells." *Applied Physics Letters*, 78:6, pp. 841–843, (2001).

U.S. Appl. No. 10/258,713, filed Oct. 25, 2002.

Roman etal (1997) "Photodiode Performance and . . . " *Advanced Materials* vol. 9, No. 15, pp. 1164–1168.

Gao, etal (1997) "Efficient photodetectors and . . . " *Synthetic Metals* vol. 84, pp. 979–980.

Conboy, etal (1998) "Impact of Solvent Vapor Annealing . . . " *Journal of Physical Chemistry B* vol. 102, No. 23, pp. 4516–4525.

Shaheen, etal (2001) "2.5% efficient organic plastic solar cells" *Applied Physics Letters* vol. 78, No. 6, pp. 841–843.

Quali, etal (1999) "Oligo(phenylenevinylene)/Fullerene Photovoltaic Cells: Influence of Morphology" *Advanced Materials*, vol. 11, No. 18, pp. 1515–1518.

* cited by examiner

PHOTOVOLTAIC CELL

CROSS REFERENCE TO RELATED APPLICATIONS

Applicants claim priority under 35 U.S.C. §119 of Austrian Application No. A 734/2000, filed: Apr. 27, 2000. Applicants also claim priority under 35 U.S.C. §365 of PCT/AT01/00129, filed: Apr. 27, 2001. The international application under PCT article 21(2) was not published in English.

The present invention relates to a photovoltaic cell having a photoactive layer made of two components, namely an electron donor and an electron acceptor, particularly a conjugated polymer component and a fullerene component, and having two metallic electrodes provided on both sides of the photoactive layer.

Plastics having extensive $\pi$-electron systems, in which single and double bonds follow one another alternately in sequence, are referred to as conjugated plastics. These conjugated plastics have energy bands which are comparable with semiconductors in regard to electron energy, so that they may also be transferred from the non-conductive state into the metallically conductive state through doping. Examples of such conjugated plastics are polyphenylenes, polyvinylphenylenes (PPV), polythiophenes, or polyanilines. The efficiency of energy conversion of photovoltaic polymer cells made of a conjugated polymer is, however, typically between $10^{-3}$ and $10^{-2}\%$. To improve this efficiency, heterogeneous layers made of two conjugated polymer components have already been suggested (U.S. Pat. No. 5,670,791 A), one polymer component being used as an electron donor and the other polymer component as an electron acceptor. By using fullerenes, particularly buckminsterfullerenes $C_{60}$, as electron acceptors (U.S. Pat. No. 5,454,880 A), the charge carrier recombination otherwise typical in the photoactive layer may be largely avoided, which leads to an efficiency of 0.6% to 1% under AM (air mass) 1.5 conditions. In spite of this, the achievable efficiency is generally too low for a cost-effective, technical use of such photoactive layers for constructing photovoltaic cells.

The present invention is therefore based on the object of designing a photovoltaic cell of the type initially described in such a way that a further increase of the efficiency of energy conversion is possible.

The present invention achieves the object described in that an electrically insulating transition layer having a thickness of at most 5 nm is provided between at least one electrode and the photoactive layer.

The present invention is based on the circumstance that a significant resistance against a charge carrier crossing occurs in the transition region between the photoactive layer and the electrode, which may probably be attributed to reactions between the metallic electrode and the organic photoactive layer. Therefore, if these indirect influences may be suppressed, then an improvement of the charge crossing, which leads to an increase of the efficiency, must be expected if the other conditions remain identical. By providing an electrically insulating transition layer, these indirect reactions between the photoactive layer and the electrode may be largely interrupted, however, the thickness of the electrically insulating transition layer must be restricted to at most 5 nm, so that the high electric resistance of this transition layer does not hinder the easier crossing of the charge carrier between the photoactive layer and the electrode. Surprisingly, due to the very small layer thickness, so that a continuous, closed intermediate layer between the photoactive layer and the electrode is not to be expected, the barrier otherwise arising between the electrode and the photoactive layer may be largely dispensed with, without making the charge carrier crossing any more difficult. With the aid of this electrically insulating transition layer, the efficiency of photovoltaic cells may be elevated up to 20 to 25% in comparison to cells which are otherwise identically constructed but do not have this transition layer. However, optimizing the electrically insulating transition layer is necessary for this purpose.

Such an optimization may be performed by reducing the thickness of the transition layer to at most 2 nm. Of course, the desired effect may also be influenced via the chemical layer buildup. Thus, transition layers made of a salt, particularly an alkali halogenide, have proven themselves, particularly good properties in regard to the processing also able to be established using a transition layer made of a lithium fluoride, which may be vapor deposited onto the photoactive layer or the electrode in vacuum in the desired layer thickness.

BRIEF DESCRIPTION OF THE FIGURES

An example of the object of the present invention is illustrated in the drawing.

As shown in FIG. 1, the photovoltaic cell comprises a transparent glass carrier 1, onto which an electrode layer 2 made of indium/tin oxide (ITO) is applied. This electrode layer 2 generally has a comparatively rough surface structure, so that it is covered with a smoothing layer 3 made of a polymer, typically PEDOT, which is made electrically conductive through doping. Photoactive layer 4, which is made of two components, each having a layer thickness of, for example, 100 nm to a few $\mu$m depending on the application method, is applied onto this smoothing layer 3. Photoactive layer 4 is made of a conjugated polymer, preferably a PPV derivate, as an electron donor and a fullerene, particularly functionalized fullerene PCBM, as an electron acceptor. The concept of polymer is to be understood to mean both high polymers and oligomers. These two components are mixed with a solvent and applied as a solution onto smoothing layer 3 by, for example, spin coating or dripping. A squeegee or printing method could also be used to coat larger surfaces with such a photoactive layer 4. Instead of toluene, which is typical, a dispersion agent such as chlorobenzene is preferably used as a solvent, in order to ensure a fine structure of heterogeneous layer 4, which then has an average grain size smaller than 500 nm. In this way, the number of contact points between the electron donor and the electron acceptor may be significantly increased, which results in an improved charge separation and an efficiency increased to approximately 2.6% under simulated AM 1.5 conditions.

However, before counter electrode 5 is applied, a thin transition layer 6, which must be electrically insulating, having a layer thickness of, for example, 0.6 nm, is applied to photoactive layer 4. In this exemplary embodiment, this transition layer is made of an alkali halogenide, namely a lithium fluoride, which is vapor deposited in a vacuum of $2 \times 10^{-6}$ torr at a rate of 0.2 nm/min, however, continuous, closed coverage of photoactive layer 4 is not to be expected due to the low layer thickness.

If ITO is used as a hole-collecting electrode, aluminum, which is vapor deposited onto electrically insulating transition layer 6, is used as an electron-collecting electrode. Since, due to the interposition of an electrically insulating transition layer 6 between photoactive layer 4 and electrode 5, the reactions which have an interfering effect on the charge crossing between photoactive layer 4 and electrode 5 may be largely avoided in the immediate border region between electrode 5 and photoactive layer 4, precisely because electrode 5 does not directly border photoactive layer 4 in large regions, the charge carrier crossing from photoactive layer 4 to electrode 5 is improved, assuming that transition layer 6 does not itself construct an additional barrier between photoactive layer 4 and electrode 5, which may be ensured by restricting the layer thickness of transition layer 6. The electric insulation properties of transition layer 6 obviously prevent influences which hinder the crossing of the charge carrier from being effective, particularly in the transition region from photoactive layer 4 to transition layer 6.

Figure 1:
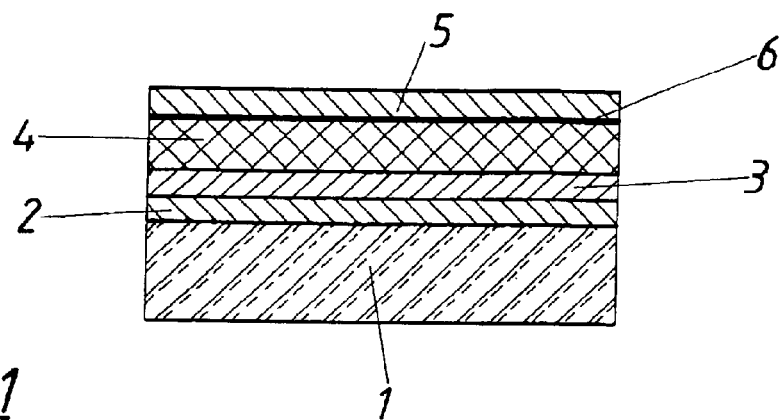
FIG. 1 shows a photovoltaic cell according to the present invention in a schematic section.
Figure 2:
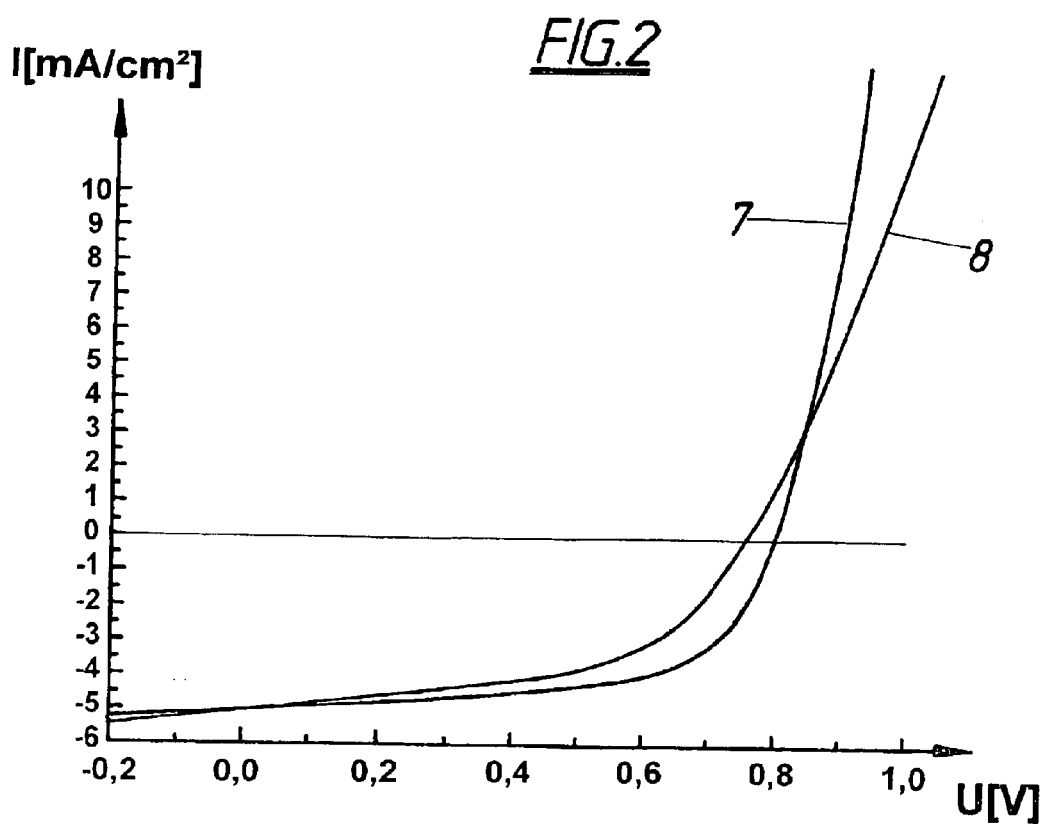
FIG. 2 shows the current-voltage characteristics of a typical photovoltaic cell and a photovoltaic cell according to the present invention.

In FIG. 2, current density I is graphed over voltage U at an excitation energy of 80 mW/cm$^2$ under simulated AM 1.5 conditions for two photovoltaic cells, which only differ through the presence of a transition layer 6 according to the present invention. If one compares characteristic 7 for a photovoltaic cell according to the present invention which characteristic 8 of a comparison cell, constructed correspondingly with the exception of transition layer 6, it may be seen that, at approximately equal short-circuit current of approximately 5.2 m A/cm$^2$, an increase of the no-load voltage from 770 mV to 810 mV could be measured. Since the bulk factor also improved from 0.52 to 0.62, the efficiency of the photovoltaic cell according to the present invention was able to be increased to 3.2% from the 2.6% of the comparison cell, which corresponds to an improvement of the energy conversion of 20 to 25%.

The present invention is, of course, not restricted to the exemplary embodiment illustrated, which shows electrically insulating transition layer 6 between electron-collecting electrode 5 and photoactive layer 4. Thus, electrically insulating transition layer 6 may also be provided between hole-collecting electrode 2 and the organic layer adjoining thereon, smoothing layer 3 in the exemplary embodiment. In addition, electrically insulating transition layer 6 may be provided only in the region of electrode 2. Since the effect of electrically insulating transition layer 6 is not restricted to conjugated polymers as an electron donor and fullerenes as an electron acceptor, the effect according to the present invention may also be observed in all photovoltaic cells having a molecular two-component layer made of an electron donor and an electron acceptor.

What is claimed is:

1. A photovoltaic cell, comprising:
    a first electrode;
    a second electrode;
    a photoactive layer between the first and second electrodes, the photoactive layer comprising:
        a conjugated polymer component;
        a fullerene component;
        a first electrically insulating layer between the photoactive layer and the first electrode; and
        a second electrically insulating layer between the photoactive layer and the second electrode.
2. The photovoltaic cell of claim 1, wherein the first electrically insulating layer has a thickness of at most five nanometers.
3. The photovoltaic cell of claims 1, wherein the first electrically insulating layer has a thickness of at most two nanometers.
4. The photovoltaic cell of claim 1, wherein the first electrically insulating layer comprises an alkali halogenide.
5. The photovoltaic cell of claim 1, wherein the first electrically insulating layer comprises lithium fluoride.
6. The photovoltaic cell of claim 1, wherein, during use of the photovoltaic cell, the first electrode is an electron-collecting electrode.
7. The photovoltaic cell of claim 1, wherein the second electrically insulating layer has a thickness of at most five nanometers.
8. The photovoltaic cell of claim 1, wherein the second electrically insulating layer comprises an alkali halogenide.
9. The photovoltaic cell of claim 7, wherein, during use of the photovoltaic cell, the second electrode is a hole-collecting electrode.
10. The photovoltaic cell of claim 9, further comprising a smoothing layer between the photoactive layer and the second electrode.
11. The photovoltaic cell of claim 10, wherein the second electrically insulating layer is between the smoothing layer and the second electrode.
12. The photovoltaic cell of claim 1, wherein, during use of the photovoltaic cell, the first electrode is a hole-collecting electrode.
13. The photovoltaic cell of claim 12, further comprising a smoothing layer between the photoactive layer and the first electrode.
14. The photovoltaic cell of claim 1, further comprising a smoothing layer between the photoactive layer and the first electrode.
15. The photovoltaic cell of claim 14, wherein the smoothing layer comprises PEDOT.
16. The photoactive cell of claim 1, wherein the fullerene comprises functionalized fullerene PCBM.
17. A photovoltaic cell, comprising:
    a first electrode;
    a second electrode;
    a photoactive layer between the first and second electrodes, the photoactive layer comprising:
        an electron donor; and
        an electron acceptor comprising a fullerene component;
        a first layer comprising an alkali halogenide between the photoactive layer and the first electrode; and
        a second layer comprising the alkali halogenide between the photoactive layer and the second electrode.
18. The photovoltaic cell of claim 17, wherein the alkali halogenide comprises lithium fluoride.
19. The photovoltaic cell of claim 17, wherein the first layer has a thickness of at most five nanometers.
20. The photovoltaic cell of claim 17, wherein the first layer has a thickness of at most two nanometers.
21. The photovoltaic cell of claim 17, wherein the electron donor comprises a conjugated polymer.
22. The photovoltaic cell of claim 21, wherein the electron acceptor comprises a fullerene component.
23. A photovoltaic cell, comprising:
    a first electrode;
    a second electrode;
    a photoactive layer between the first and second electrodes, the photoactive layer comprising:
        an electron donor comprising a conjugated polymer; and an electron acceptor;

a first layer comprising an alkali halogenide between the photoactive layer and the first electrode; and a second layer comprising the alkali halogenide between the photoactive layer and the second electrode.

24. The photovoltaic cell of claim 23, wherein the alkali halogenide comprises lithium fluoride.

25. The photovoltaic cell of claim 23, wherein the first layer has a thickness of at most five nanometers.

26. The photovoltaic cell of claim 23, wherein the first layer has a thickness of at most two nanometers.

27. The photovoltaic cell of claim 23, wherein the electron acceptor comprises a fullerene component.

* * * * *